US00RE47639E

(19) United States
(12) Reissued Patent
Hoya

(10) Patent Number: US RE47,639 E
(45) Date of Reissued Patent: Oct. 8, 2019

(54) NONVOLATILE SEMICONDUCTOR STORAGE DEVICE EQUIPPED WITH A COMPARISON BUFFER FOR REDUCING POWER CONSUMPTION DURING WRITE

(71) Applicant: Toshiba Memory Corporation, Tokyo (JP)

(72) Inventor: Katsuhiko Hoya, Kanagawa (JP)

(73) Assignee: TOSHIBA MEMORY CORPORATION, Tokyo (JP)

(21) Appl. No.: 15/004,713

(22) Filed: Jan. 22, 2016

Related U.S. Patent Documents

Reissue of:

(64) Patent No.: 8,654,596
Issued: Feb. 18, 2014
Appl. No.: 13/604,338
Filed: Sep. 5, 2012

(30) Foreign Application Priority Data

Jan. 16, 2012 (JP) ..... 2012-006321

(51) Int. Cl.
*G11C 7/10* (2006.01)
*G11C 13/00* (2006.01)
*G11C 11/16* (2006.01)

(52) U.S. Cl.
CPC ..... *G11C 7/1006* (2013.01); *G11C 11/16* (2013.01); *G11C 13/00* (2013.01)

(58) Field of Classification Search
CPC ..... G06F 3/0616; G06F 11/1008; G11C 5/66; G11C 7/1075; G11C 11/15; G11C 11/16;
(Continued)

(56) References Cited

U.S. PATENT DOCUMENTS 6,438,665 B2 * 8/2002 Norman ..... G06F 3/0616 711/103
6,490,208 B2 * 12/2002 Yoon ..... G11C 29/808 365/200

(Continued)

FOREIGN PATENT DOCUMENTS

| | | |
|---|---|---|
| JP | 2011060388 A | 3/2011 |
| JP | 2012084218 A | 4/2012 |
| WO | 2012009179 A1 | 1/2012 |

OTHER PUBLICATIONS

Japanese Office Action dated Aug. 14, 2014, filed in Japanese counterpart Application No. 2012-006321, 5 pages (with translation).

(Continued)

*Primary Examiner* — Christopher E. Lee
(74) *Attorney, Agent, or Firm* — Kim & Stewart LLP

(57) ABSTRACT

A semiconductor storage device includes plural bit lines and plural word lines. The memory cell array has plural memory cells that are connected with the bit lines and word lines, and can store data. Plural sense amplifiers detect the data stored in the memory cells. Plural write drivers write data in the memory cells. A comparison buffer temporarily stores the write data to be written in the memory cells by the write driver. In a series of write sequences, the comparison buffer stores the read data from the memory cells selected as the write object and the write data to be written in the selected memory cells. After a series of write sequences, when the pre-charge command for resetting the voltage of the bit lines is received, the write execution command is executed so that the comparison buffer executes write in the selected memory cells.

10 Claims, 12 Drawing Sheets

(58) Field of Classification Search
CPC . G11C 11/406; G11C 29/808; G11C 29/1201; G11C 11/1675; G11C 29/50
USPC ..... 365/100, 148, 171, 189.04, 189.07, 365/189.16, 189.2, 230.03; 711/101, 103; 714/718, 758, 764, 773
See application file for complete search history.

(56) References Cited

U.S. PATENT DOCUMENTS

| | | | | |
|---|---|---|---|---|
| 6,584,589 | B1 * | 6/2003 | Perner | G11C 29/50 365/201 |
| 6,785,154 | B2 * | 8/2004 | Sunaga | G11C 11/15 365/100 |
| 7,016,255 | B2 * | 3/2006 | Lee | G11C 7/1075 365/230.03 |
| 7,298,642 | B2 * | 11/2007 | Ise | G11C 11/16 365/148 |
| 7,353,324 | B2 | 4/2008 | Tanaka | |
| 7,376,801 | B2 * | 5/2008 | Moriyama | G11C 7/02 711/101 |
| 8,077,501 | B2 | 12/2011 | Ong | |
| 8,077,505 | B2 | 12/2011 | Chen et al. | |
| 8,077,508 | B1 | 12/2011 | Ong | |
| 8,117,508 | B2 | 2/2012 | Tokiwa | |
| 8,233,335 | B2 * | 7/2012 | Nishimura et al. | 365/189.15 |
| 8,482,969 | B2 * | 7/2013 | Hoya et al. | 365/158 |
| 8,904,142 | B2 | 12/2014 | Tanaka | |
| 2006/0106969 | A1 | 5/2006 | Hoogerbrugge | |
| 2008/0151656 | A1 | 6/2008 | Nakai | |
| 2009/0161423 | A1 * | 6/2009 | Sugibayashi | G11C 11/15 365/171 |
| 2009/0196109 | A1 * | 8/2009 | Walker | G11C 5/066 365/189.07 |
| 2009/0259895 | A1 * | 10/2009 | Jung | G11C 29/1201 714/718 |
| 2009/0282318 | A1 * | 11/2009 | Hoya | G06F 11/1008 714/773 |
| 2009/0319870 | A1 * | 12/2009 | Yamada | G06F 11/1008 714/764 |
| 2010/0103723 | A1 | 4/2010 | Kawai et al. | |
| 2011/0078538 | A1 * | 3/2011 | Ikegawa | G11C 11/1675 714/758 |
| 2011/0158008 | A1 * | 6/2011 | Nishimura et al. | 365/189.15 |
| 2011/0228613 | A1 * | 9/2011 | Lee | G11C 11/406 365/189.04 |
| 2012/0069639 | A1 * | 3/2012 | Hoya et al. | 365/158 |
| 2012/0243304 | A1 | 9/2012 | Hoya | |

OTHER PUBLICATIONS

Lower Power Double Data Rate 2 (LPDDR2), JESD209-2, Mar. 2009, JEDEC Solid State Technology Association, 220 pages.
www.jedec.org, Low Power Double Data Rate 2 (LPDDR2), JESD209-2E, (Revision of JESD209-2D, Dec. 2010), Apr. 2011, JEDEC Solid State Technology Association, 284 pages.

* cited by examiner

NONVOLATILE SEMICONDUCTOR STORAGE DEVICE EQUIPPED WITH A COMPARISON BUFFER FOR REDUCING POWER CONSUMPTION DURING WRITE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is based upon and claims the benefit of priority from Japanese Patent Application No. 2012-006321, filed Jan. 16, 2012; the entire contents of which are incorporated herein by reference.

FIELD

Embodiments described herein relate to a semiconductor storage device.

BACKGROUND

MRAM (magnetic RAM) and other nonvolatile memories have been developed as substitutes of DRAM (dynamic random access memory) and other volatile memories.

However, for MRAM, because data are written as current flows in MTJ (magnetic tunnel junction) elements, it takes some time to perform a write operation. Consequently, when the memory cells belonging to the same bank are repeatedly accessed over a short time period, it may not be possible to carry out a data write.

In addition, when a data write is carried out, if the logic of the data already stored in the memory cells is identical to the logic of the data to be written the write current (cell current) used to overwrite existing data with the new data is wastefully used.

DETAILED DESCRIPTION

In general, example embodiments will be explained with reference to figures. However, the invention is not limited to these embodiments.

According to an embodiment, there is provided a semiconductor storage device that can carry out data writes continuously while reducing the wasteful power consumption during the data write operation.

The semiconductor storage device according to the present embodiment has plural bit lines and plural word lines. The memory cell array has plural memory cells that can store data and are connected to the bit lines and word lines. Plural sense amplifiers detect the data stored in the memory cells. Plural write drivers write data to the memory cells. A comparison buffer temporarily stores the write data to be written in the memory cells by the write driver. During a series of write sequences, the comparison buffer stores the read data from memory cells selected as the write object (the storage destination) and the write data to be written in the selected memory cells. After the series of write sequences, when the pre-charge command for resetting the voltage of the bit lines is received, the write execution command is executed so that the comparison buffer executes a write to the selected memory cells of the write data stored in the comparison buffer.

Embodiment 1

Figure 1:
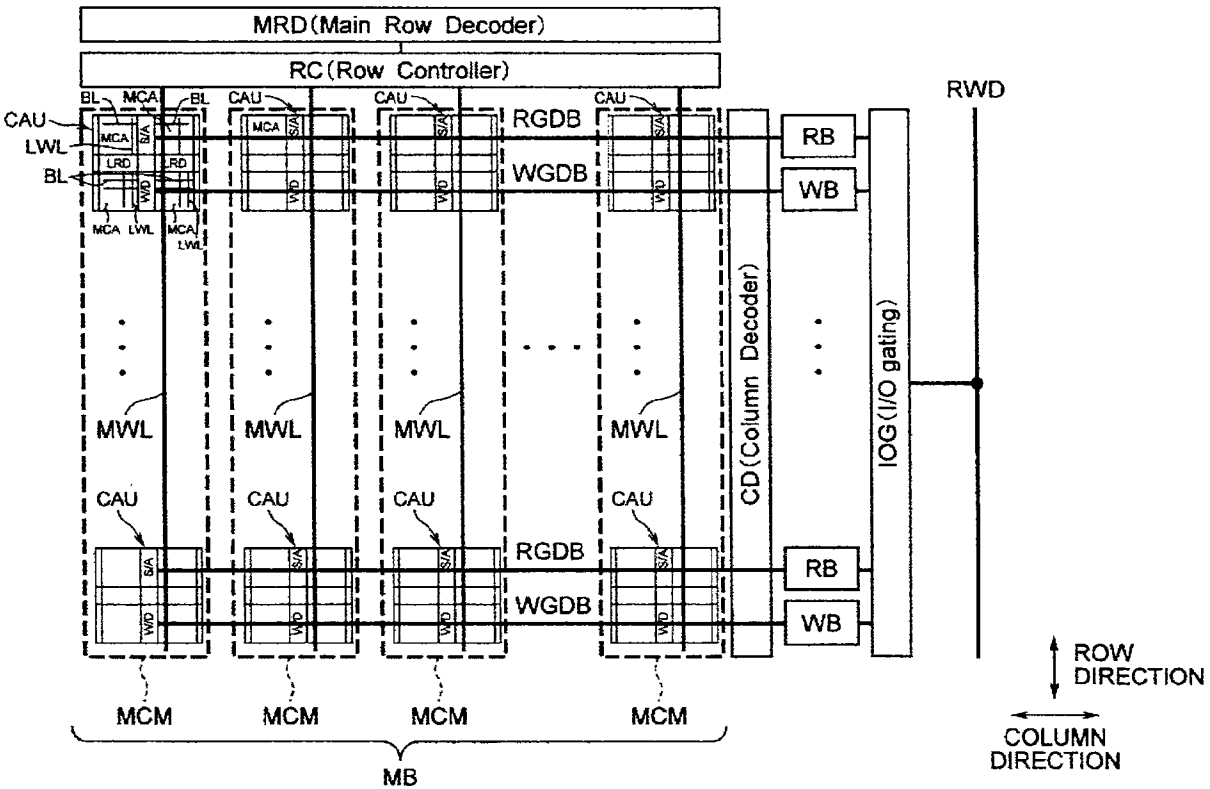
FIG. 1 is a block diagram illustrating a memory cell array of an MRAM and its peripheral circuit according to a first embodiment.

FIG. 1 is a block diagram illustrating a magnetic random access memory (hereinafter to be referred to as MRAM) memory cell array and its peripheral circuit according to Embodiment 1. In addition to the MRAM, the present embodiment may also be used in the memories (such as PCRAM, ReRAM, etc.) using resistance change type elements.

The MRAM in this embodiment has the following parts: a cell array unit CAU containing plural memory cell arrays MCA, plural main word lines MWL, plural local word lines LWL, plural read global data buses RGDB, plural write global data buses WGDB, sense amplifier S/A, read buffer RB, write driver W/D, write buffer WB, row controller RC, main row decoder MRD, column decoder CD, input/output gate circuit IOG, and read/write data line RWD. There is no specific restriction on the numbers of the various structural elements shown in FIG. 1. The components shown in FIG. 1 may be arranged in various ways. In addition, while source lines are included in the actual device, they are not shown here.

Each memory cell array MCA contains plural memory cells MC arranged in a matrix-shaped two-dimensional configuration. The memory cells MC are arranged at cross points between the bit lines BL and local word lines LWL shown in FIG. 3. The bit lines BL extend in the column direction, and the local word lines LWL extend in the row direction orthogonal to the column direction.

The main word lines MWL are connected with the local row decoder LRD, and the local row decoder LRD is connected with the memory cells MC via local word lines LWL. In the respective cell array units CAU in the memory cell macros MCM, there is a one-to-one corresponding relationship between the main word lines MWL and the local word lines LWL. Consequently, according to the present embodiment, there is no need to distinguish the main word lines MWL and the local word lines LWL from each other. The phrase "word lines" refers to both types.

Plural memory cell arrays MCA form a cell array unit CAU. As shown in FIG. 1, four memory cell arrays MCA form a cell array unit CAU. However, there is no specific restriction on the number of memory cell arrays MCA contained in each cell array unit CAU.

The plural cell array units CAU that share the main word lines MWL form a memory cell macro MCM. The memory cell macro MCM is a unit that can be activated under one read command to simultaneously read the data or simultaneously write the data under one write command. Plural memory cell macros MCM that share the read global data bus RGDB and write global data bus WGDB form a macro block MB. There is no specific restriction on the number of the cell array units CAU contained in each memory cell macro MCM.

The sense amplifier S/A is arranged corresponding to plural bit lines BL. Sense amplifier S/A detects the data transmitted via specific bit lines among the plural bit lines BL. The write driver W/D is arranged corresponding to plural bit lines BL. The write driver W/D carries out write of data to the memory cells MC via specific bit lines among the plural bit lines BL.

Each cell array unit CAU has one or more sense amplifiers S/A and one or more write drivers W/D. Plural sense amplifiers S/A in a memory cell macro MCM are connected with different read global data buses RGDB. Plural write drivers W/D in a memory cell macro MCM are connected with different write global data buses WGDB. That is, the read global data buses RGDB and the write global data buses WGDB are arranged with a one-to-one corresponding relationship with the sense amplifiers S/A and write drivers W/D, respectively. Consequently, the read global data buses RGDB are arranged corresponding to bit lines and sense amplifiers S/A and write global data buses WGDB are arranged corresponding to the bit lines BL and write drivers W/D, respectively.

The read global data buses RGDB and the write global data buses WGDB extend in the column direction. The main word lines MWL extend in the row direction orthogonal to the column direction.

The read global data buses RGDB each are connected to the read buffer RB via column decoder CD. The write global data buses WGDB each are connected to the write buffer WB via column decoder CD. Here, the column decoder CD has the function of selecting the bit line BL according to the column address. In this case, the column decoder CD selects and drives one bit line BL with respect to one sense amplifier S/A.

The read buffer RB and write buffer WB are connected to the read/write data lines RWD via the input/output gate circuit IOG. The read buffer RB amplifies the read data obtained from the corresponding read global data bus RGDB and sends the obtained read data to the input/output gate circuit IOG. The read buffer RB then sends the read data to outside elements via the input/output gate circuit IOG. The write buffer WB amplifies the write data obtained from the read/write data line RWD, and sends the data to the memory cell macros MCM1 through MCM4.

The number of read/write data lines RWD is the same as the number of pairs of read buffer RB and write buffer WB. That is, in this embodiment there is one read/write data line RWD for each read buffer RB and write buffer WB pair. Read/write data lines RWD can read the data out simultaneously in parallel from one memory cell macro MCM. The read/write data lines RWD also can fetch the write data from outside the memory chip for a memory cell macro in parallel with each other the same time. For example, when the number of read buffer RB/write buffer WB pairs in one macro block MBA is 64, then 64 read/write data lines RWD are arranged corresponding to the pairs, respectively. As a result, the memory design would allow simultaneous reading or writing of 64-bit data.

The main word lines MWL are connected to the row controller RC. The row controller RC is connected to the main row decoder MRD. The main row decoder MRD decodes the row address. According to the row address, the row controller RC selects one main word line MWL from each of the plural memory cell macros MCM in the macro block MB. As the main word line MWL is selected, the one local word line LWL corresponding to the main word line MWL is selected in each of the cell array units CAU. As a result, in the memory cell macro MCM, each sense amplifier S/A can detect the data of the memory cell MC (hereinafter to be referred to as selected memory cell MC) corresponding to the cross point between the bit line BL selected by the column address and the main word line MWL (or the local word line LWL) selected by the row address. Also, in the memory cell macro MCM, the respective write driver W/D can write the data into the selected memory cell MC.

According to the present embodiment, when the device is in a data write mode, the write data are temporarily stored in the comparison buffer CMPB (see FIG. 3) after being transmitted from input/output gate circuit IOG via the read/write data line RWD. The data of the write object memory cell MC from the selected page is also temporarily read in to the comparison buffer CMPB. The write to the memory cell MC is not yet carried out. Next, as the memory enters the pre-charge state, the comparison buffer CMPB compares the write data with the corresponding read data from the memory cell, then, on the basis of the comparison result, the comparison buffer CMPB controls the write buffer WB such that only the write data different in logic from the read data are written to the memory cell macro MCM. Based on the comparison of read and write data the write driver W/D writes only the write data which does not match the read data from the memory cell MC. When the logic of the read data is identical to the logic of the write data, the comparison buffer CMPB controls the write buffer WB so that the write data are not written in the memory cell macro MCM.

Figure 2:
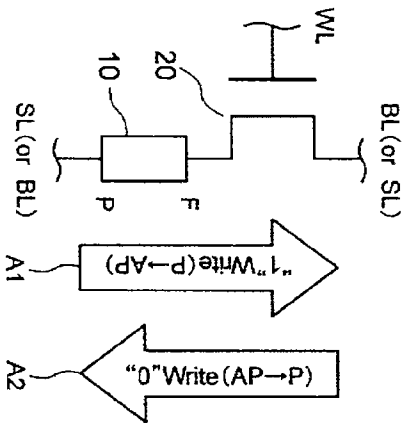
FIG. 2 is a diagram illustrating the components and operation of a single memory cell MC.

FIG. 2 is a diagram illustrating the components and operation of a single memory cell MC. Here, the respective memory cell MC contain the magnetic tunnel junction element (MTJ) 10 and the cell transistor 20. The MTJ element 10 and the cell transistor 20 are connected in tandem between the bit line BL and the source line SL. In the memory cell MC, the cell transistor 20 is arranged on the side neighboring the bit line BL, and the MTJ element 10 is arranged on the side neighboring the source line. The gate of the cell transistor 20 is connected to the word line WL (main word line MWL or local word line LWL).

The MTJ element that exploits the TMR (tunneling magnetoresistive) effect has a laminated structure including two ferromagnetic layers and a nonmagnetic layer (insulating film) sandwiched between them, and it stores the digital data corresponding to change in the magnetic resistance due to the spin polarization tunnel effect. The MTJ element acquires a low resistance state or a high resistance state corresponding to the configuration of magnetization of two ferromagnetic layers. For example, the low resistance state is defined as 0, while the high resistance state is defined as 1, so that the MTJ element can record 1-bit data. Of course, one may also use a scheme in which the low resistance state is defined as 1 while the high resistance state is defined as 0.

The MTJ element may be formed, for example, by sequentially laminating an anchoring layer, a tunnel barrier layer, and a recording layer. Here, the anchoring layer F and the recording layer P are made of ferromagnetic material, while the tunnel barrier layer is made of an insulating film. The anchoring layer F is a layer that anchors the orientation of magnetization. The recording layer P can change its orientation of magnetization, so that data can be stored corresponding to the orientation of the magnetization.

In the write mode, as a current flows in the direction indicated by arrow A1, the orientation of the recording layer P becomes the anti-parallel state with respect to the magnetization orientation of the anchoring layer F, and the state becomes the high resistance state (data 1). On the other hand, when the current flows in the direction indicated by arrow A2 in the write mode, the orientation of magnetization of the anchoring layer F and that of the recording layer P are parallel with each other, and the state becomes the low resistance state (data 0). In this way, the TMJ element can be written with different data depending on the current direction.

Figure 3:
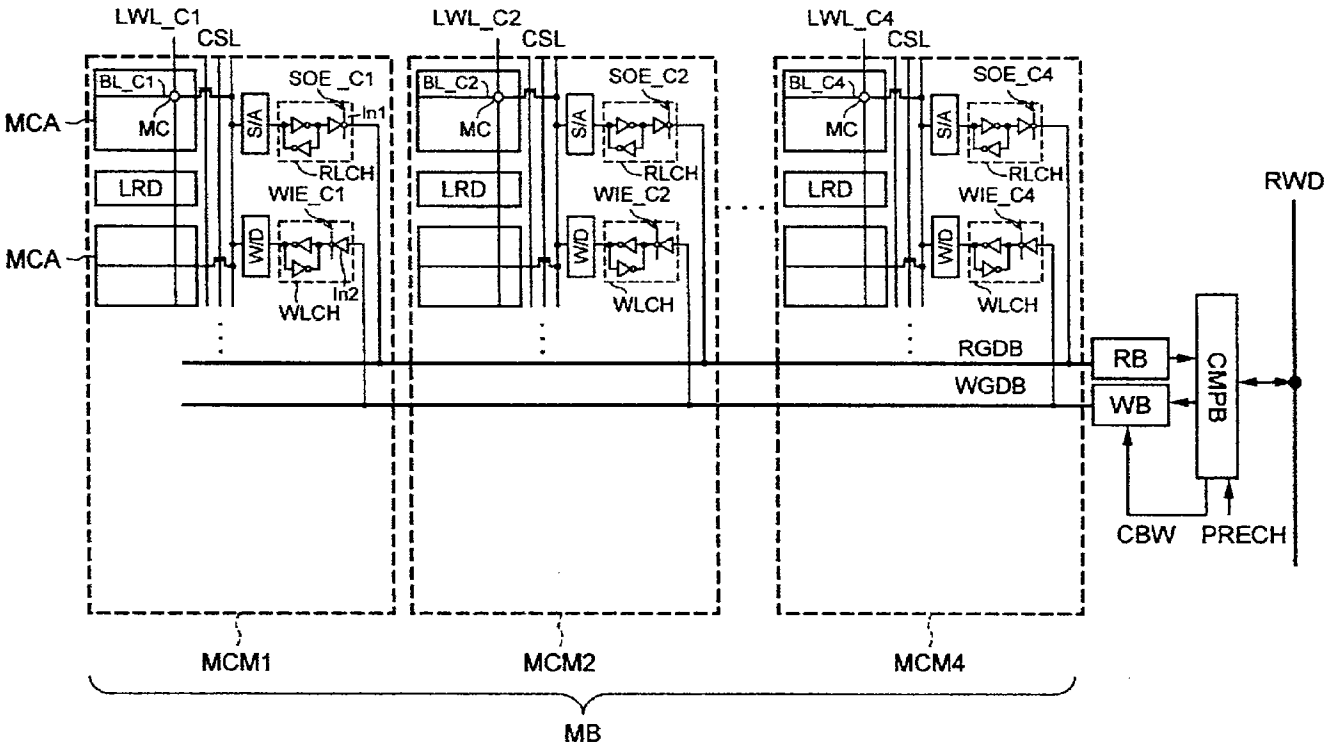
FIG. 3 is a diagram illustrating the connection relationship between a read global data bus RGDB as well as a write global data bus WGDB and memory cell macros MCM1 through MCM4.

FIG. 3 is a diagram illustrating the connection relationship between the read global data bus RGDB as well as the write global data bus WGDB and the memory cell macros MCM1 through MCM4. As shown in FIG. 3, as an example, two memory cell arrays MCA are shown in each of the memory cell macros MCM1 through MCM4. FIG. 3 shows only one sense amplifier S/A/write driver W/D pair and one read global data bus RGDB/write global data bus WGDB pair. However, in the practical structure, a plurality of these pairs is used.

The read global data bus RGDB is connected to the read buffer RB, and the write global data bus WGDB is connected to the write buffer WB. The read buffer RB and the write buffer WB are connected to the read/write data line RWD via comparison buffer CMPB. The comparison buffer CMPB is assembled in the input/output gate circuit IOG.

The local row decoder LRD is arranged between memory cell arrays MCA in each of the memory cell macros MCM1 through MCM4. The local row decoder LRD works as a buffer for driving the local word line LWL. Consequently, row controller RC drives word line WL via main word line MWL and local row decoder LRD. In FIG. 3, the main word line MWL is not shown.

The memory cell macros MCM in the same macro block MB share a read global data bus RGDB and a write global data bus WGDB. But, the sense amplifiers S/A in the same memory cell macro MCM are connected to different read global data buses RGDB via plural read latch parts RLCH. The read latch parts RLCH are arranged corresponding to the sense amplifiers S/A, and each read latch part RLCH is connected between the sense amplifier S/A and a read global data bus RGDB. The read latch part RLCH latches the data detected by the sense amplifier S/A. The read latch part RLCH contains a gated inverter In1 that outputs the latched data at the time determined by the output enable signal SOE_Ci (where i represents an integer).

The write drivers W/D in the memory cell macro MCM are connected to different write global data buses WGDB via write latch parts WLCH. The write latch parts WLCH are arranged corresponding to the write drivers W/D, and each write latch part WLCH is connected between a corresponding write driver W/D and a write global data bus WGDB. The write latch part WLCH contains the gated inverter In2 that receives the write data from the write global data bus WGDB at the time determined by the input enable signal WIE_Ci. As a result, the write latch part WLCH latches the data to be sent to the write driver W/D.

The sense amplifier S/A and the write driver W/D are connected to the bit line BL selected by the column selection line CSL. As shown in FIG. 3, while one memory cell array MCA is connected to the sense amplifier S/A, the other memory cell array MCA is connected to the write driver W/D. However, the memory cell array MCA can be connected to both the sense amplifier S/A and the write driver W/D via the column selection line CSL. The voltage of the column selection line CSL is controlled by the column decoder CD.

The comparison buffer CMPB is a circuit that temporarily stores the write data and the data stored in the selected memory cell MC where the data are to be written in the data write operation, and it compares the logic states of these data.

In the data read mode, one main word line MWL is selected in each memory cell macro MCM, and the data are simultaneously detected by the sense amplifiers S/A via read global data buses RGDB from the memory cells MC connected to the selected main word line MWL. The data detected by the sense amplifiers S/A are temporarily stored in the corresponding read latch parts RLCH. The output enable signals SOE_C1 through SOE_C4 are then sequentially activated consecutively at different times such that the data are continuously output from the read latch parts RLCH of each memory cell macro MCM to the read global data buses RGDB. The read data are then temporarily stored in the comparison buffer CMPB via the read global data bus RGDB. In this case, read latch parts RLCH in one memory cell macro MCM may simultaneously send the data to the corresponding read global data bus RGDB connected to them. As a result, it is possible to transmit the data in parallel using all of the read global data buses RGDB without any waste in the macro block MB. On the other hand, the read latch parts RLCH in the different memory cell macros MCM of a macro block MB transmit the data to the read global data buses RGDB at different times. Thus, it is possible to continuously transmit plural data without collisions in the read global data buses RGDB.

In the data write mode, the comparison buffer CMPB temporarily stores the write data received via the read/write data lines RWD. The input enable signals WIE_C1 through WIE_C4 are then sequentially activated consecutively, and the data are continuously fetched into the write latch parts WLCH of the respective memory cell macros MCM via the write global data buses WGDB and the write buffers WB. In this case, the write latch parts WLCH in one memory cell macro MCM may fetch the data simultaneously from comparison buffers CMPB connected to them, respectively. As a result, data can be transmitted in parallel by using all of the write global data buses WGDB in the macro block MB without waste. On the other hand, the write latch parts WLCH of the different memory cell macros MCM in one macro block MB receive the data at different times from one comparison buffer CMPB. Thus, it is possible to continuously transmit the plural data to the write latch parts WLCH without collision in the write global data buses WGDB.

Figure 4:
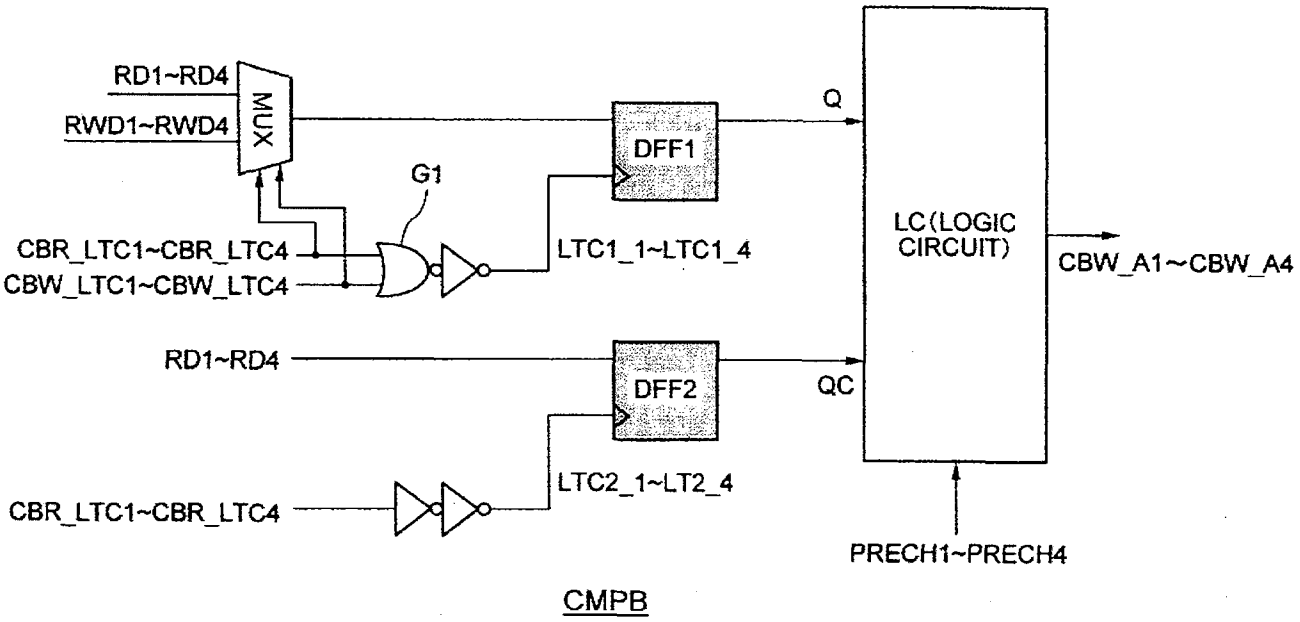
FIG. 4 is a block diagram illustrating the internal components of a comparison buffer CMPB.

FIG. 4 is a block diagram illustrating the internal components of a comparison buffer CMPB. The comparison buffer CMPB has a multiplexer MUX, D flip-flop circuits DFF1, DFF2, logic circuit LC, and gate circuit G1.

The multiplexer MUX is connected to the read buffer RB and write buffer WB, and it receives the read data RD1 through RD4 and the write data RWD1 through RWD4. The read data RD1 through RD4 and write data RWD1 through RWD4 correspond to the memory cell macros MCM1 through MCM4, respectively.

The multiplexer MUX transmits any of the read data RD1 through RD4 and write data RWD1 through RWD4 selectively to the D flip-flop circuit DFF1. For example, when the read commands CBR_LTC1 through CBR_LTC4 are activated, the multiplexer MUX selects the read data RD1 through RD4; when the write commands CBW_LTC1 through CBW_LTC4 are activated, it selects write data RWD1 through RWD4.

The gate circuit G1 is a NOR gate. The read commands CBR_LTC1 through CBR_LTC4 and write commands CBW_LTC1 through CBW_LTC4 are input to it and, the latch command LTC1 to the D flip-flop circuit DFF1 is activated when any of these commands are active.

At the time of activation of latch commands LTC1_1 through LTC1_4, the D flip-flop circuit DFF1 as the first latch part latches the read data RD1 through RD4 or write data RWD1 through RWD4 from the multiplexer MUX.

At the time of activation of latch commands LTC2_1 through LTC2_4 (by, for example, activation of the read commands CBR_LTC1 through CBR_LTC4), the D flip-flop circuit DFF2 as the second latch part latches the read data RD1 through RD4.

The D flip-flop circuits DFF1, DFF2 are set so that the read data obtained via the read global data buses RGDB and read buffer RB can be held as one page portion (for example, 128 bits). The D flip-flop circuit DFF1 is set so that it can hold one page portion (for example, 128 bits) of the write data obtained via the read/write data line RWD.

The logic circuit LC as the logic part receives the pre-charge command PRECH and read data RD1 through RD4 or write data RWD1 through RWD4 latched in the D flip-flop circuits DFF1, DFF2. On the basis of the pre-charge command PRECH and the read data RD1 through RD4 and write data RWD1 through RWD4, the write execution command CBW is activated by the logic circuit LC. The logic circuit LC outputs the write execution command CBW to the write buffer WB. For example, at the time of activation of the pre-charge command PRECH, the logic circuit LC compares the logic of the read data RD1 through RD4 from the D flip-flop circuit DFF2 with the logic of the read data RD1 through RD4 or the write data RWD1 through RWD4 from the D flip-flop circuit DFF1. When the logic states of these data are different, the logic circuit LC activates the write execution command CBW. When these data have the same logic, the logic circuit LC maintains the inactive state for the write execution command CBW (i.e., the write execution command CBW is not activated).

When the write execution command CBW is activated, the write buffer WE sends the write data of the corresponding address among the write data stored in the D flip-flop circuit DFF1 to the write driver W/D. When the write execution command CBW is in the inactive state, the write buffer WE does not send the write data of the corresponding address among the write data stored in the D flip-flop circuit DFF1 to the write driver W/D. In addition, the pre-charge commands PRECH1 through PRECH4 have the bank address (the address of the memory cell macro MCM). Consequently, when the write buffer WB receives the pre-charge commands PRECH1 through PRECH4, it may transfer the write data to any of the memory cell macros MCM1 through MCM4 according to the bank address.

The logic circuit LC is shared by the plural write data RWD1 through RWD4 and plural read data RD1 through RD4. In this case, the logic circuit LC may execute a comparison between the write data RWD1 through RWD4 and the read data RD1 through RD4 at different times.

(Data Write Operation)

Figure 5:
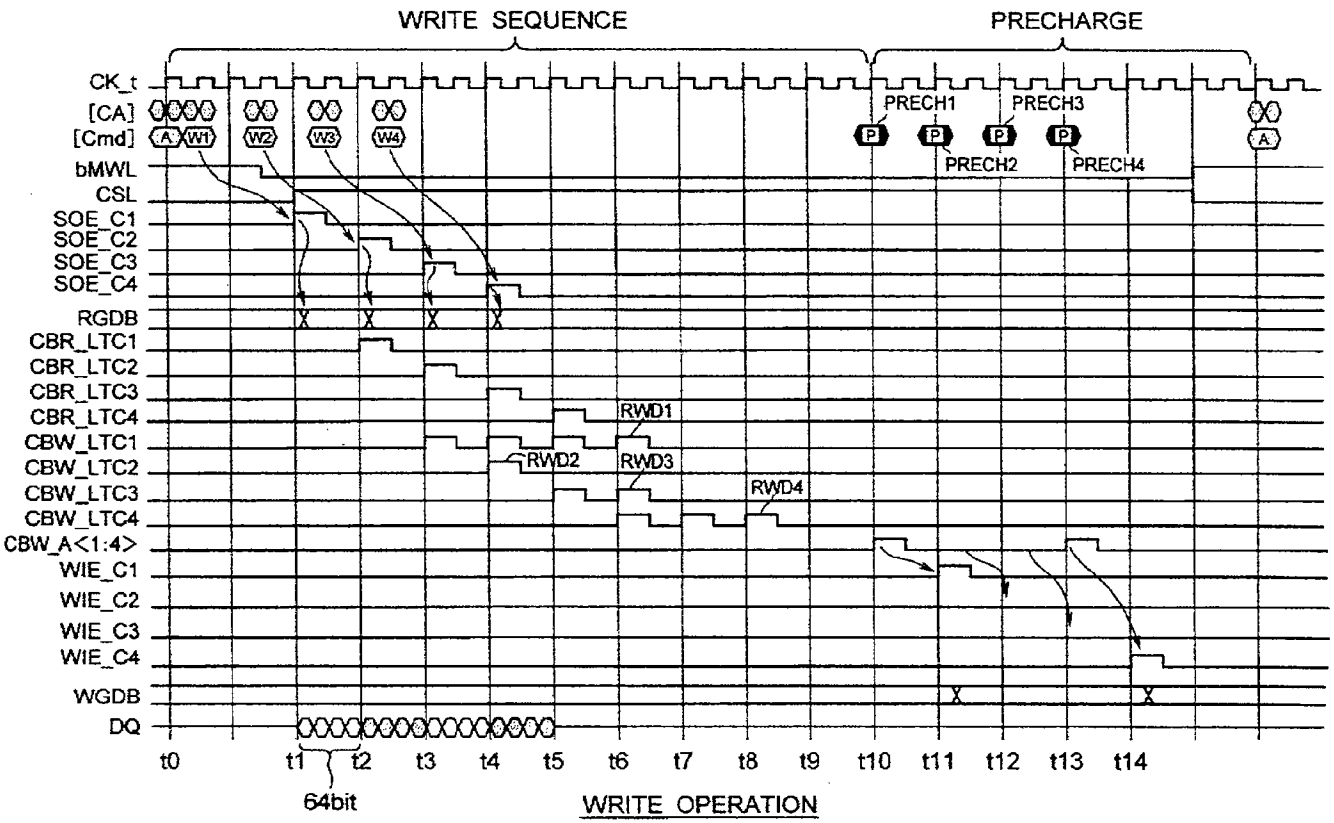
FIG. 5 is a time diagram illustrating a data write operation of the memory of the first embodiment.

FIG. 5 is a time diagram illustrating the data write operation of the memory according to Embodiment 1. Here, for example, it is assumed for explanation purposes that each macro block MB contains the four memory cell macros MCM1 through MCM4. Consequently, the write operation (write sequence) to the respective memory cell macros MCM1 through MCM4 is started by the four write commands W1 through W4.

In the data write operation according to the present embodiment, the sense amplifier S/A reads the data from the memory cell MC selected as the write object (the selected memory cell MC), and the read data from the selected memory cell MC are stored in the comparison buffer CMPB. Also, the comparison buffer CMPB receives the write data to be written in the selected memory cell MC from the read/write data line RWD and stores the write data. That is, before the data are actually written, the data are read from the selected memory cell MC. Consequently, on the basis of the write commands W1 through W4, the read commands CBR_LTC1 through CBR_LTC4 are also activated.

In the following, the data write operation will be explained in more detail.

According to clock CK_t, the addresses CA (column address, row address, etc.) and the various types of commands Cmd (active command A, write commands W1 through W4, etc.) are sent to the memory. According to the row address, one main word line MWL is selected in each memory cell macro MCM, and the local word line LWL in each cell array unit CAU connected to the selected main word line MWL is also selected. In addition, according to the column address, the bit line BL connected to the respective sense amplifier S/A in the memory cell macro MCM is selected. The multiple sense amplifiers S/A in the memory cell macro MCM can simultaneously read the data from the selected memory cells MC connected to the selected bit lines BL and the selected local word lines LWL.

At t0, the memory receives the active command A, and the row address is selected. Next, as the memory receives the write commands W1 through W4, the column address is selected.

As the word enable signal bMWL is activated on the low level, according to the row address, it is possible to drive the word lines LWL_C1 through LWL_C4. When the column selection line CSL is activated on the high level, as explained with reference to FIG. 3, the bit line BL selected according to the column address is connected to the sense amplifier S/A. As a result, the sense amplifiers S/A of the respective memory cell macros MCM1 through MCM4 can detect the data of the selected memory cells MC. The data detected by the sense amplifiers S/A are latched in the read latch part RLCH.

Accompanying the reception of the write commands W1 through W4, at the time of t1 through t4, the output enable signals SOE_C1 through SOE_C4 are continuously activated. As a result, the read data latched in the read latch parts RLCH of the memory cell macros MCM1 through MCM4 are sent continuously via the read global data buses RGDB to the comparison buffer CMPB. Next, accompanying the reception of the write commands W1 through W4, at the time of t1 through t5, the read commands CBR_LTC1 through CBR_LTC4 are continuously activated.

When the read command CBR_LTC1 is activated at t2, the data read from the memory cell macro MCM1 are held in both the D flip-flop circuits DFF1, DFF2 of the comparison buffer CMPB shown in FIG. 4. Similarly, when the read command CBR_LTC2 is activated at t3, the data read from the memory cell macro MCM2 are held in both the D flip-flop circuits DFF1, DFF2 of the comparison buffer CMPB. When the read command CBR_LTC3 is activated at t4, the data read from the memory cell macro MCM3 are held in both the D flip-flop circuits DFF1, DFF2 of the comparison buffer CMPB. When the read command CBR_LTC4 is activated at t5, the data read from the memory cell macro MCM4 are held in both the D flip-flop circuits DFF1, DFF2 of the comparison buffer CMPB. As a result, the respective read data of the memory cell macros MCM1 through MCM4 are stored in the D flip-flop circuits DFF1, DFF2 of the comparison buffer CMPB.

In addition, because the address indicated by the read command CBR_LTC2 is different from the address indicated by the read command CBR_LTC1, the D flip-flop circuits DFF1, DFF2 hold the data read from the memory cell macro MCM2 aside (separate) from the read data from the memory cell macro MCM1 and the write data to the memory cell macro MCM1. Also, because the address indicated by the read command CBR_LTC3 is different from the address indicated by the read command CBR_LTC1 and CBR_LTC2, the D flip-flop circuits DFF1, DFF2 hold the read data from the memory cell macro MCM3 aside from the read data from memory cell macros MCM1, MCM2 and the write data to the memory cell macros MCM1, MCM2. In addition, because the address indicated by the read command CBR_LTC4 is different from the address indicated by the read commands CBR_LTC1 through CBR_LTC3, the D flip-flop circuits DFF1, DFF2 hold the read data from the memory cell macro MCM4 aside from the read data from the memory cell macros MCM1 through MCM3 and the write data to the memory cell macros MCM1 through MCM3.

At the time of t1 through t5, the write data are sent to the comparison buffer CMPB via the data line DQ. At the time of t3 through t9, according to the write commands CBW_LTC1 through CBW_LTC4, the comparison buffer CMPB stores the write data RWD1 through RWD4.

(Operation According to Write Command CBW_LTC1)

At time t3 after activation of the read command CBR_LTC1, the write command CBW_LTC1 is activated. Here, the write command CBW_LTC1 corresponds to the read command CBR_LTC1, and it has the address of the selected memory cell MC of the memory cell macro MCM1. That is, the write data sent to the comparison buffer CMPB due to activation of the write command CBW_LTC1 are data having the same address as the read data sent to the comparison buffer CMPB due to activation of the read command CBR_LTC1.

As the write command CBW_LTC1 is activated, the D flip-flop circuit DFF1 of the comparison buffer CMPB shown in FIG. 4 holds the write data. In this case, the read data stored in the D flip-flop circuit DFF1 are refreshed (overwritten) by the write data. This is because the write command CBW_LTC1 and the read command CBR_LTC1 show the selected memory cells MC with the same address.

As a result, the read data from the selected memory cell MC of the memory cell macro MCM1 are held in the D flip-flop circuit DFF2. The data to be written in the selected memory cell MC of the memory cell macro MCM1 are held in the D flip-flop circuit DFF1.

Afterwards, at the time of t4 through t6, the write command CBW_LTC1 is activated. This means that the memory continuously receives the write data of the same address. In the series of write sequences, when plural write data of the same address are received, the finally received write data are the effective data. Consequently, the data to be written in the selected memory cell MC of the memory cell macro MCM1 are refreshed each time that activation of the write command CBW_LTC1 is carried out at the time of t1 through t4. The D flip-flop circuit DFF1 then effectively holds the write data RWD1 finally received at time t6. For example, suppose during the time of t4 through t6, the write command CBW_LTC1 is activated four times with the incoming write data being 1, 1, 1, 0, respectively. The finally received piece of data "0" is taken as the write data RWD1 that will be written to the selected memory cell MC.

(Operation According to Write Command CBW_LTC2)

At t4 after activation of the read command CBR_LTC2, the write command CBW_LTC2 is activated. The write command CBW_LTC2 corresponds to the read command CBR_LTC2, and it has the address of the selected memory cell MC of the memory cell macro MCM2.

As the write command CBW_LTC2 is activated, as shown in FIG. 4, the D flip-flop circuit DFF1 of the comparison buffer CMPB holds the write data. In this case, due to activation of the read command CBR_LTC2, the read data stored in the D flip-flop circuit DFF1 are refreshed by the write data. This is because the write command CBW_LTC2 and the read command CBR_LTC2 show the selected memory cells MC of the same address.

As a result, the read data from the selected memory cell MC of the memory cell macro MCM2 are held in the D flip-flop circuit DFF2, and the data to be written in the selected memory cell MC of the memory cell macro MCM2 are held in the D flip-flop circuit DFF1.

In this write sequences, the write command CBW_LTC2 is activated only once. Consequently, the D flip-flop circuit DFF1 effectively holds the write data RWD2 received at time t4.

Because the address shown in the write command CBW_LTC2 is different from the address shown in the write command CBW_LTC1, the D flip-flop circuit DFF1 holds the write data RWD2 aside from the write data RWD1. For the read data RD2, the D flip-flop circuit DFF2 holds the read data RD2 aside from the read data RD1.

(Operation According to Write Command CBW_LTC3)

At t5 after activation of the read command CBR_LTC3, the write command CBW_LTC3 is activated. The write command CBW_LTC3 corresponds to the read command CBR_LTC3, and it has the address of the selected memory cell MC of the memory cell macro MCM3.

When the write command CBW_LTC3 is activated, as shown in FIG. 4, the D flip-flop circuit DFF1 of the comparison buffer CMPB holds the write data. In this case, the read data stored in the D flip-flop circuit DFF1 due to activation of the read command CBR_LTC3 are refreshed by the write data. This is because the write command CBW_LTC3 and the read command CBR_LTC3 show the selected memory cells MC of the same address.

As a result, the read data from the selected memory cell MC of the memory cell macro MCM3 are held in the D flip-flop circuit DFF2, and the data to be written in the selected memory cell MC of the memory cell macro MCM3 are held in the D flip-flop circuit DFF1.

In this write sequences, the write command CBW_LTC3 is activated twice. The D flip-flop circuit DFF1 effectively holds the last write data RWD3 fetched at t6.

Because the address indicated by the write command CBW_LTC3 is different from the address indicated by the write commands CBW_LTC1 and CBW_LTC2, the D flip-flop circuit DFF1 holds the write data RWD3 aside from the write data RWD1 and RWD2. For the read data RD3, also, the D flip-flop circuit DFF2 holds the read data RD3 aside from the read data RD1 and RD2.

(Operation According to the Write Command CBW_LTC4)

At t6 after activation of the read command CBR_LTC4, the write command CBW_LTC4 is activated. The write command CBW_LTC4 corresponds to the read command CBR_LTC4, and it has the address of the selected memory cell MC of the memory cell macro MCM4.

As the write command CBW_LTC4 is activated, as shown in FIG. 4, the D flip-flop circuit DFF1 of the comparison buffer CMPB holds the write data. In this case, the read data stored in the D flip-flop circuit DFF1 due to activation of the read command CBR_LTC4 are refreshed by the write data. This is because the write command CBW_LTC4 and read command CBR_LTC4 indicate the selected memory cells MC of the same address.

As a result, the read data from the selected memory cell MC of the memory cell macro MCM4 are held in the D flip-flop circuit DFF2, and the data to be written in the selected memory cell MC of the memory cell macro MCM4 are held in the D flip-flop circuit DFF1.

In this write sequences, the write command CBW_LTC4 is activated thrice. The D flip-flop circuit DFF1 effectively holds the last write data RWD4 received at t8.

Because the address indicated by the write command CBW_LTC4 is different from the address indicated by the write commands CBW_LTC1 through CBW_LTC3, the D flip-flop circuit DFF1 holds the write data RWD4 aside from the write data RWD1 through RWD3. For the read data RD4, also, the D flip-flop circuit DFF2 holds the read data RD4 aside from the read data RD1 through RD3.

In this way, according to the present embodiment, the comparison buffer CMPB latches the write data RWD1 through RWD4 and read data RD1 through RD4 corresponding to the addresses of the plural selected memory cells MC in a series of respective write sequences.

Afterwards, after receiving a series of write commands W1 through W4, the write sequence comes to an end, and the pre-charge commands PRECH1 through PRECH4 are activated. The number of pre-charge commands PRECH1 through PRECH4 generated is equal to the number (bank number) of the memory cell macros MCM that execute the interleaved operation. After receiving the activation of the pre-charge commands PRECH1 through PRECH4, the logic circuit LC of the comparison buffer CMPB compares the logic of the read data RD1 through RD4 with that of the write data RWD1 through RWD4 for each of their addresses. In this case, the logic circuit LC detects the difference/identity in the logic of the output data of the D flip-flop circuits FFD1 and FFD2 for each address.

Next, when the read data RD1 through RD4 and the write data RWD1 through RWD4 have different logic states, the logic circuit LC activates the write execution commands CBW_A1 through CBW_A4. For example, when the read data RD1 and write data RWD1 have different logic states, the logic circuit LC activates the write execution command CBW_A1.

When the read data RD1 through RD4 and the write data RWD1 through RWD4 have the same logic, the logic circuit LC does not activate the write execution commands CBW_A1 through CBW_A4; instead, it keeps them in the inactive state. For example, when the read data RD2 and write data RWD2 have the same logic state, the logic circuit LC does not activate the write execution command CBW_A2; instead, it keeps the command in the inactive state.

In the example shown in FIG. 5, the read data RD1 and the write data RWD1 have different logic states, as do the read data RD4 and write data RWD4. On the other hand, the write data RWD2 and RWD3 has the same logic read data RD2 and RD3, respectively. Consequently, the logic circuit LC activates the write execution commands CBW_A1 and CBW_A4 (t10, t13), while it keeps the write execution commands CBW_A2 and CBW_A3 in the inactive state.

Next, corresponding to the activation of the write execution commands CBW_A1, CBW_A4, the write buffer WB sends the write data RWD1, RWD4 via the write global data bus WGDB to the write drivers W/D of the memory cell macros MCM1, MCM4. Here, because the write data RWD1, RWD4 are stored in the D flip-flop circuit DFF1, respectively, they are sent from the D flip-flop circuit DFF1.

For example, at t11, the input enable signal WIE_C1 is activated, and the write latch part WLCH of the memory cell macro MCM1 receives the write data RWD1. At t14, the input enable signal WIE_C4 is activated, and the write latch part WLCH of the memory cell macro MCM4 receives the write data RWD4. On the other hand, the input enable signals WIE_C2, WIE_C3 for the memory cell macros MCM2, MCM3, which will not have different data written to them, are not activated.

Next, as the respective write drivers W/D of the memory cell macros MCM1, MCM4 receive the write data RWD1, RWD4, within the pre-charge period, the write data RWD1, RWD4 are written in the selected memory cells MC of the memory cell macros MCM1, MCM4.

As explained above, according to the present embodiment, in the data write operation, the data of the selected memory cell MC as the write object are read, and the comparison buffer CMPB compares the logic of the read data RD1 through RD4 with the logic of the write data RWD1 through RWD4. If the logic of the read data is different from the logic of the write data, the write driver W/D writes the write data to the corresponding selected memory cell. On the other hand, if the logic of the read data is identical to the logic of the write data, the write driver W/D does not write the write data to the corresponding selected memory cell.

Consequently, the write driver W/D may execute the write operation to the selected memory cell MC (that is, cell current may be made to flow to the selected memory cell MC) only in the memory cell macros MCM1, MCM4 that have the logic of the write data different from the logic of the data already stored in the selected memory cell MC. On the other hand, for the memory cell macros MCM2, MCM3 with the logic of the write data identical to the logic of the data stored in the selected memory cell MC, there is no need for the write driver W/D to carry out write operation to the selected memory cell MC (that is, there is no need to have a cell current flow to the selected memory cell MC). As a result, it is possible to suppress the wasteful power consumption in the data write operation.

In addition, according to the present embodiment, the write data RWD1 through RWD4 fetched by a series of write commands W1 through W4 are temporarily stored in the comparison buffer CMPB. After the reception of a series of write commands W1 through W4, the pre-charge commands PRECH1 through PRECH4 are activated, so that the comparison buffer CMPB activates the write execution commands CBW_A1 through CBW_A4. As a result, the write driver W/D executes the actual write operation to the selected memory cell MC during the pre-charge period. Consequently, the write time from the viewpoint of the user is only the time of data write to the write buffer WB, and the actual write time to the selected memory cell MC is not sensed by the user. As a result, according to the present embodiment, the MRAM has an extremely high write operation speed, and an interleaved write operation can be easily carried out.

In addition, because the four pre-charge commands PRECH1 through PRECH4 have the addresses (bank addresses) of the memory cell macros MCM1 through MCM4 respectively, it is possible to have the write operation to the respective memory cell macros MCM1 through MCM4 dispersed in time during the pre-charge period. As a result, it is possible to prevent simultaneous write operation to plural memory cell macros MCM, and it is possible to suppress instant surge of the current consumption. That is, according to the present embodiment, the MRAM can have an even write current.

In addition, in a series of write sequences when write data of the same address are continuously input, the comparison buffer CMPB holds only the last received write data RWD1 through RWD4. During the pre-charge period, the write driver W/D writes the last received write data RWD1 through RWD4 to the selected memory cells MC. Consequently, even when a memory cell MC of the same memory cell macro MCM is repeatedly accessed over a short time (that is, a time shorter than the time needed for write of the data to the MTJ element), there will still be no defective write and the necessary time for writing the data to the MTJ element can be sufficiently obtained.

In addition, there is no specific restriction on the capacity of the write data and read data stored in the comparison buffer CMPB. In a series of write sequences, the comparison buffer CMPB may store two or more pages of data in each of the read buffer RB and the write buffer WB. Each page is a data read unit or a data write unit.

(Data Read Operation)

In the data read operation in which the data are read to the outside, the data are temporarily stored in the comparison buffer CMPB, and they are then output to the outside via the read/write data line RWD. The data read operation through the step involving storage of the read data in the comparison buffer CMPB can be easily understood with reference to FIG. 5 and the accompanying explanation above. Consequently, the operation from detection of the read data to storage of the data in the comparison buffer CMPB will not be explained repeatedly. However, instead of the write commands W1 through W4 supplied previously, the memory receives the read commands R1 through R4, and the read operation is executed on the basis of the read commands R1 through R4.

As shown in FIG. 4, when the D flip-flop circuits DFF1, DFF2 of the comparison buffer CMPB receive the read commands CBR_LTC1 through CBR_LTC4, both of them hold the read data RD1 through RD4. Next, as the write command is not input, the data of the same address and latched in the D flip-flop circuits DFF1, DFF2 have the same logic. Consequently, in the data read operation, the logic circuit LC does not set the write execution commands CBW_A1 through CBW_A4 to the active state, and the write buffer WB does not operate.

The comparison buffer CMPB may output the read data stored in the D flip-flop circuit DFF1 via the read/write data line RWD without alteration.

Also, as shown in FIG. 3, the read latch parts RLCH of the respective memory cell macros MCM1 through MCM4 send the data sequentially to the read global data bus RGDB on the basis of the output enable signals SOE_C1 through SOE_C4. Consequently, it is possible to carry out a burst read operation.

Embodiment 2

Figure 6:
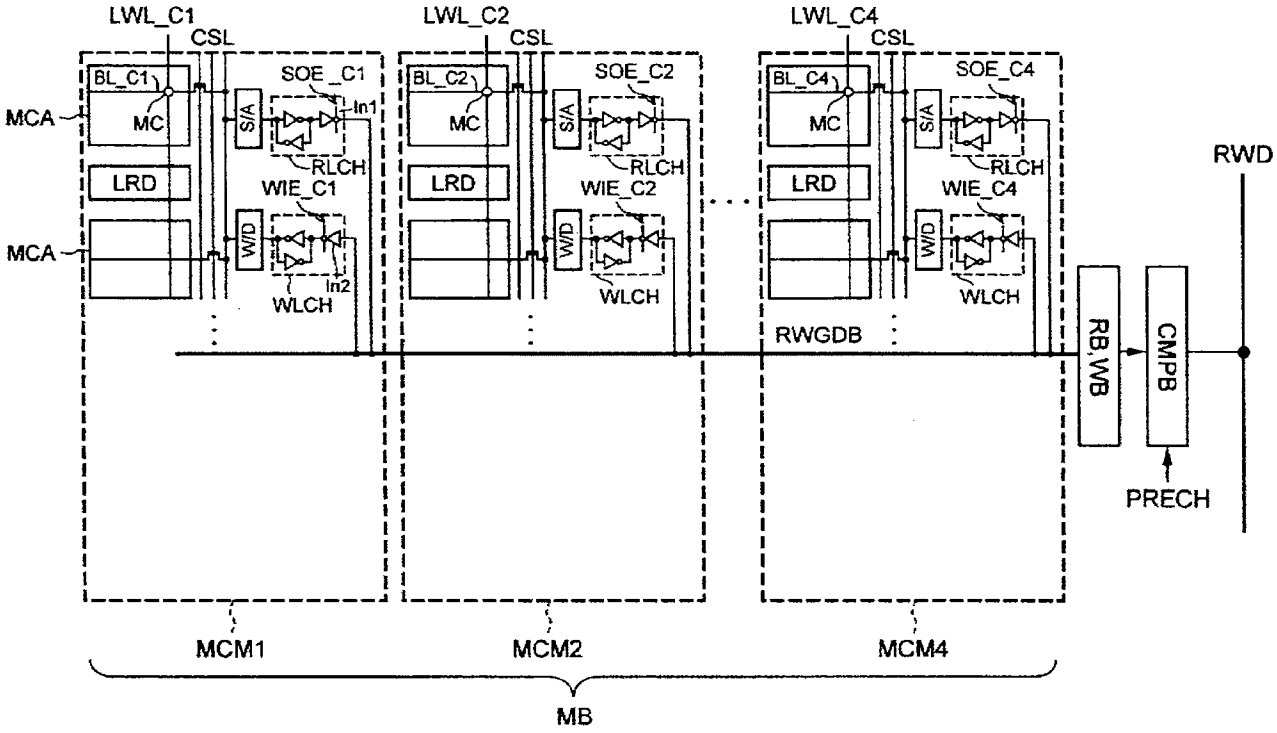
FIG. 6 is a block diagram illustrating the components of an MRAM according to a second embodiment.

FIG. 6 is a block diagram illustrating the components of an MRAM device according to Embodiment 2. According to Embodiment 2, the read global data bus RGDB and the write global data bus WGDB are shared, and they are set as the global data bus RWGDB. The read latch part RLCH and write latch part WLCH of the respective memory cell macros MCM1 through MCM4 are both connected to the global data bus RWGDB, and they are then connected to the comparison buffer CMPB via the global data bus RWGDB. Consequently, while the comparison buffer CMPB in Embodiment 1 is of the dual port type, the comparison buffer CMPB in Embodiment 2 is of the single port type.

As shown in FIG. 5, in the data write operation, the time for transferring the write data in the write global data bus WGDB (t11 to t14) is during the pre-charge period. Consequently, the time of transfer of the write data in the write global data bus WGDB does not overlap the time (t1 to t5) in which the transfer of the read data in the read global data bus RGDB occurs. Consequently, there is no problem even when the global data bus RWGDB is shared as in Embodiment 2. The read buffer RB and the write buffer WB can, therefore, be connected to the shared global data bus RWGDB. The functions of the read buffer RB and the write buffer WB are the same as in Embodiment 1. The remaining features of Embodiment 2 may be the same as the corresponding features in Embodiment 1.

Figure 7:
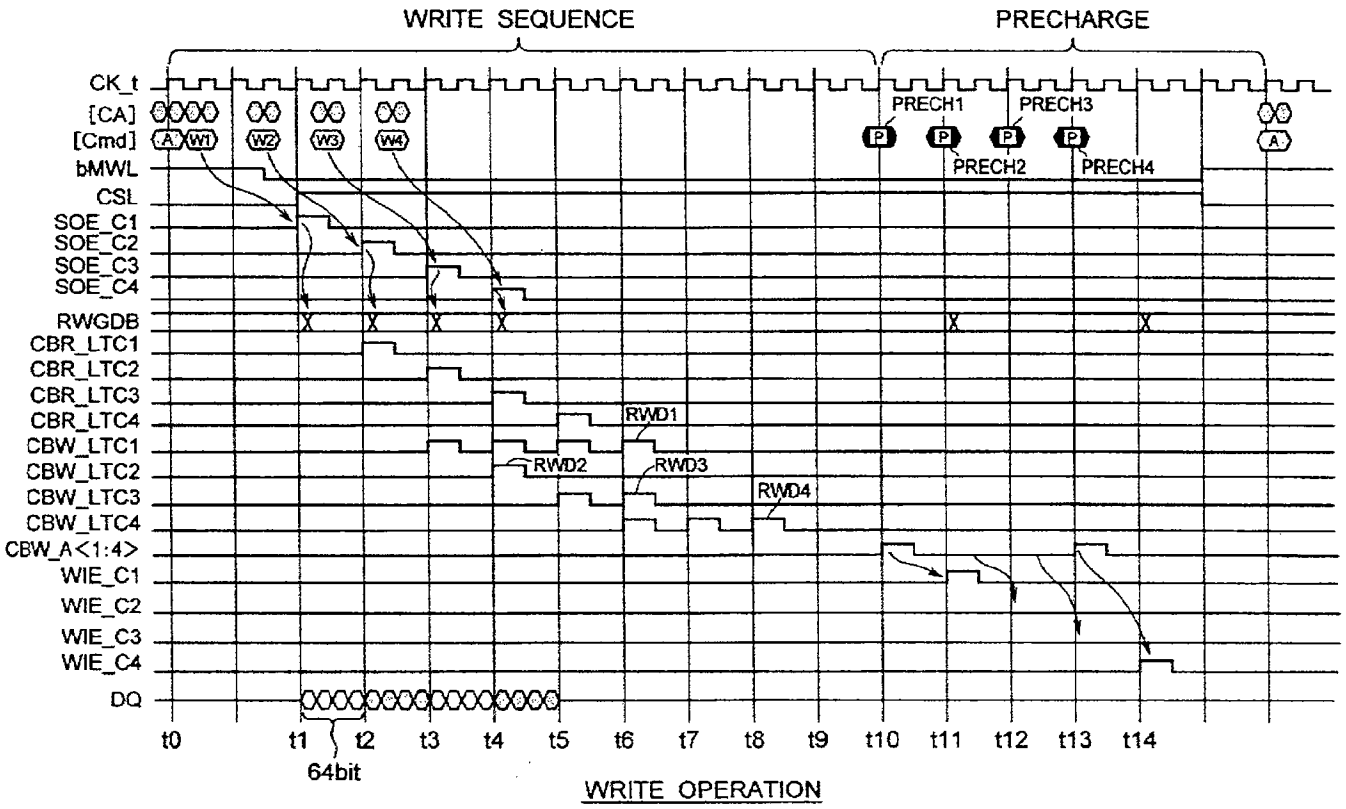
FIG. 7 is a time diagram illustrating a data write operation of the memory of the second embodiment.

FIG. 7 is a time diagram illustrating the data write operation of the memory according to Embodiment 2. Here, the global data bus RWGDB is shared for read and write, and the read data and the write data are transferred at different times. The remaining features of the operation according to Embodiment 2 may be the same as those of the corresponding features of the operation according to Embodiment 1.

According to Embodiment 2, the same effects as those of Embodiment 1 can be realized. In addition, according to Embodiment 2, the global data bus RWGDB is shared for the read and write, so that the separate read buffer RB and write buffer WB are omitted. Consequently, the MRAM according to Embodiment 2 is favorable for forming smaller memory chips.

Embodiment 3

Figure 8:
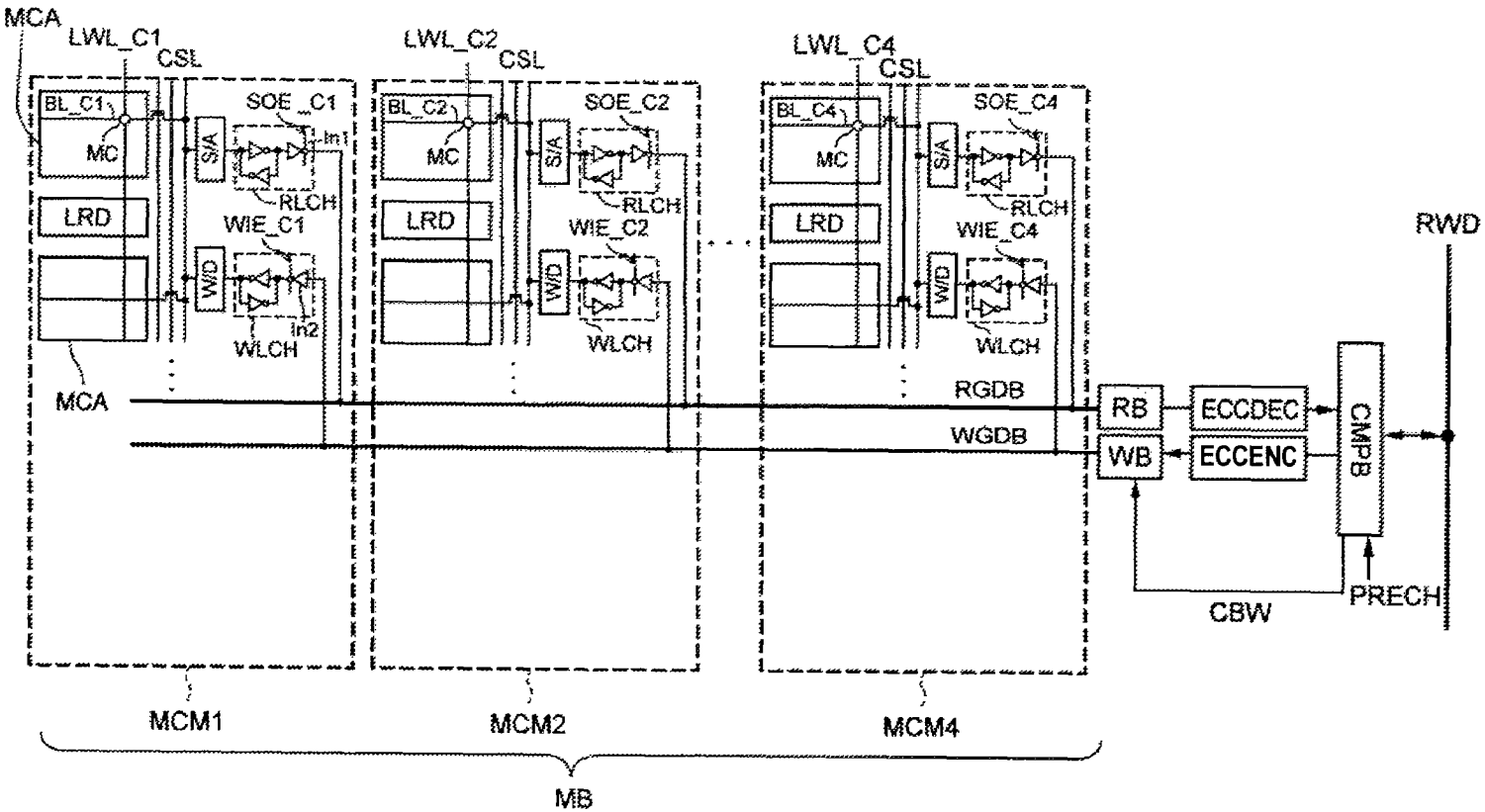
FIG. 8 is a block diagram illustrating the components of an MRAM according to a third embodiment.

FIG. 8 is a block diagram illustrating the components of the MRAM according to Embodiment 3. According to Embodiment 3, ECC (error correcting code) decoder ECCDEC is arranged between the read buffer RB and the comparison buffer CMPB, and ECC encoder ECCENC is arranged between the write buffer WB and the comparison buffer CMPB. The other features of Embodiment 3 may be the same as the corresponding features of Embodiment 1.

Figure 9:
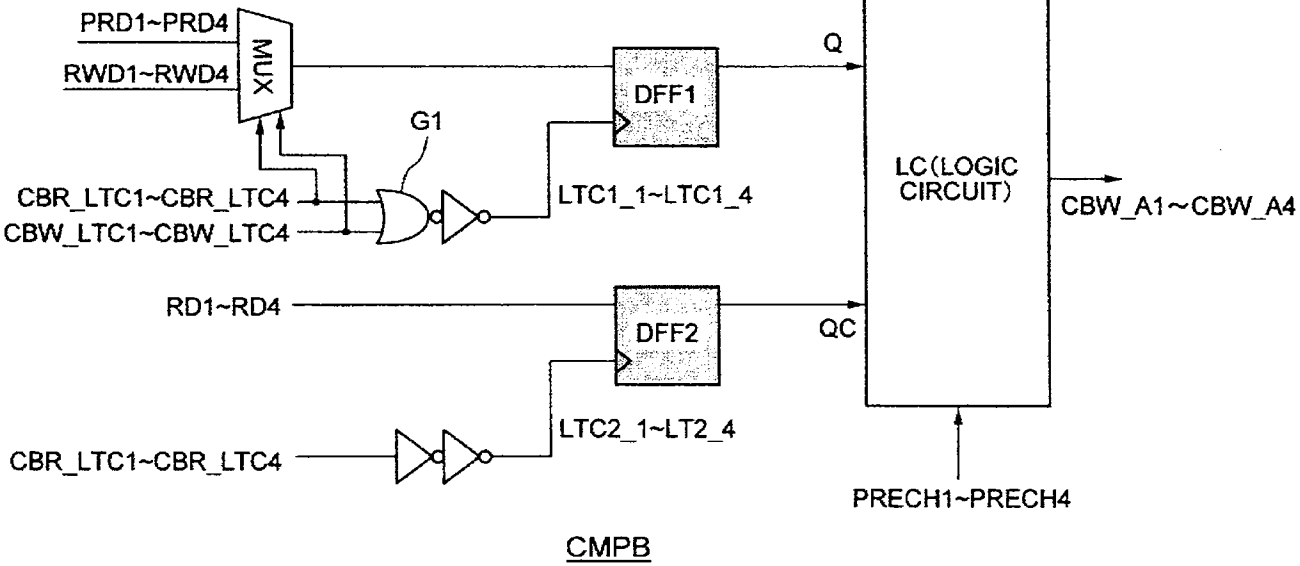
FIG. 9 is a block diagram illustrating the components of a comparison buffer CMPB according to the third embodiment.

FIG. 9 is a block diagram illustrating the components of the comparison buffer CMPB according to Embodiment 3. The components of the comparison buffer CMPB itself is the same as the components of the comparison buffer CMPB in Embodiment 1. However, multiplexer MUX receives the read data PRD1 through PRD4 corrected by the ECC decoder ECCDEC. Consequently, by means of activation of the read commands CBR_LTC1 through CBR_LTC4, the D flip-flop circuit DFF1 latches the corrected read data PRD1 through PRD4.

The data write operation according to Embodiment 3 is otherwise the same as the data write operation according to Embodiment 1. As explained with reference to FIG. 5, by means of activation of the read commands CBR_LTC1 through CBR_LTC4, the D flip-flop circuit DFF1 latches the corrected read data PRD1 through PRD4. However, after that, as the write commands CBE_LTC1 through CBE_LTC4 are activated, the D flip-flop circuit DFF1 is updated by the write data RWD1 through RWD4.

Consequently, the comparison buffer CMPB compares the read data RD1 through RD4 actually stored in the selected memory cell MC with the write data RWD1 through RWD4. On the other hand, in the data read operation in which the data are read to the outside, the D flip-flop circuit DFF1 stores the corrected read data PRD1 through PRD4, and the D flip-flop circuit DFF2 stores the read data RD1 through RD4. Consequently, when the corrected read data PRD1 through PRD4 and the read data RD1 through RD4 are different from each other, the logic circuit LC activates the write execution commands CBW_A1 through CBW_A4. As a result, the write buffer WB has the corrected read data PRD1 through PRD4 held in the D flip-flop circuit DFF1 written in the memory cell MC. That is, when the logic of the data stored in the memory cells MC is incorrect, the comparison buffer CMPB can write the corrected read data PRD1 through PRD4 to correct the memory cells MC.

In this way, Embodiment 3 may also be used on the MRAM having an ECC circuit. The remaining features of operation of Embodiment 3 may be the same as those of Embodiment 1. As a result, Embodiment 3 also can realize the same effects as those of Embodiment 1.

Embodiment 4

Figure 10:
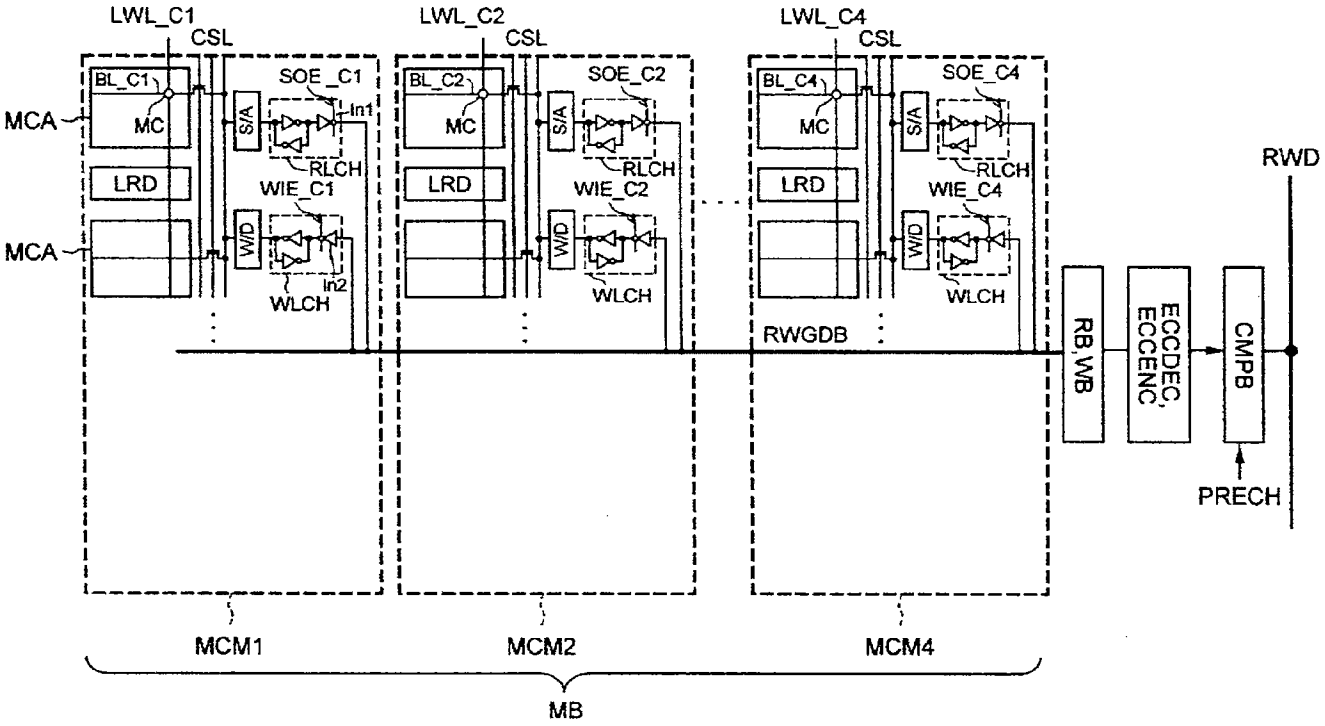
FIG. 10 is a block diagram illustrating the components of an MRAM according to a fourth embodiment.

FIG. 10 is a block diagram illustrating the components of the MRAM according to Embodiment 4. Embodiment 4 is a combination of Embodiment 2 and Embodiment 3. That is, according to Embodiment 4, the read global data bus RGDB and the write global data bus WGDB are shared, and they are set as the global data bus RWGDB. Also, an ECC decoder ECCDEC and ECC encoder ECCEN are arranged between the comparison buffer CMPB and the read buffer RB as well as the write buffer WB.

Just as in Embodiment 2, the global data bus RWGDB is shared for read and write. However, the read data and the write data are transferred at different times. Consequently, even when the global data bus RWGDB shown in FIG. 10 is shared, there is still no problem. Also, because the MRAM has the ECC circuit ECCDEC and ECCENC, the comparison buffer CMPB works in the same way as the comparison buffer CMPB in Embodiment 3.

As a result, Embodiment 4 has both the effects of Embodiment 2 and Embodiment 3.

Embodiment 5

Figure 11:
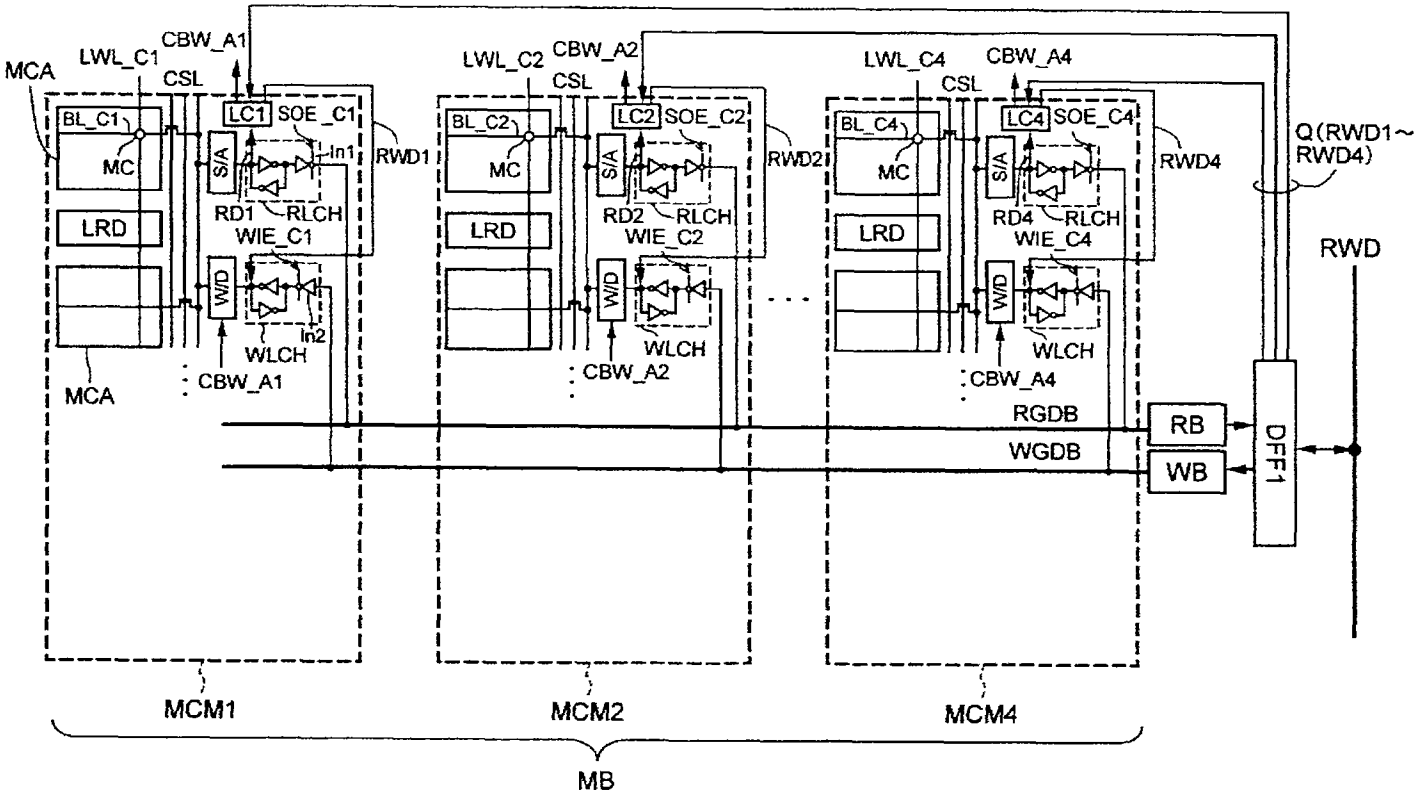
FIG. 11 is a block diagram illustrating the components of an MRAM according to a fifth embodiment.
Figure 12:
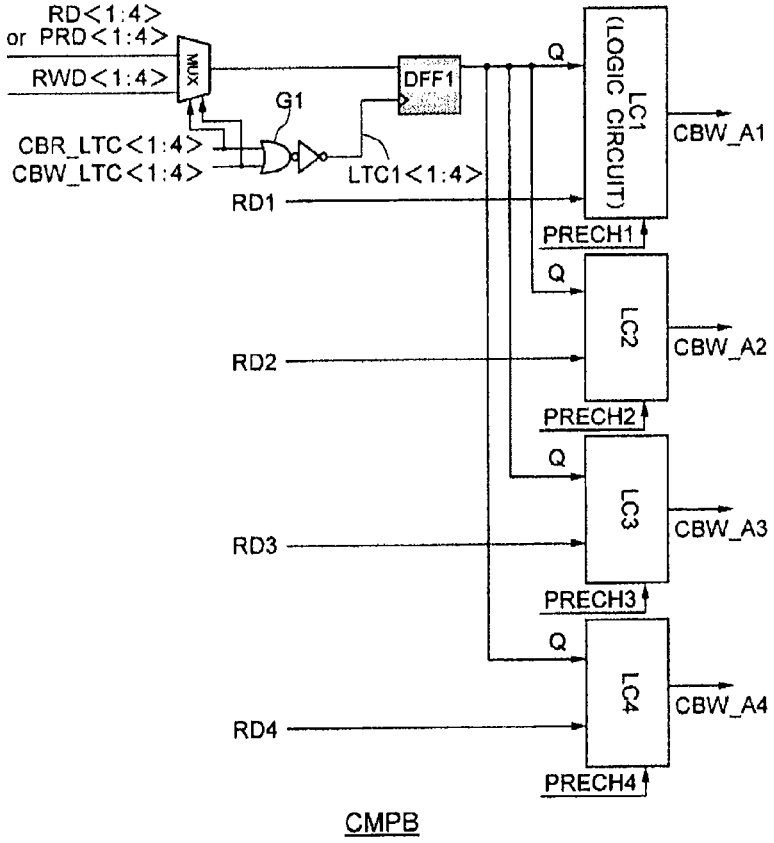
FIG. 12 is a block diagram illustrating the components of a comparison buffer CMPB according to the fifth embodiment.

FIG. 11 is a block diagram illustrating the components of the MRAM according to Embodiment 5. FIG. 12 is a block diagram illustrating the components of the comparison buffer CMPB according to Embodiment 5. As shown in FIG. 11, in the comparison buffer CMPB, the logic circuits LC1 through LC4 are arranged in the memory cell macros MCM1 through MCM4, respectively. The logic circuits LC1 through LC4 have a similar components and function as that of the logic circuit LC in Embodiment 1. The logic circuits LC1 through LC4 are connected to the read latch part RLCH and receive the read data RD1 through RD4 from the read latch part RLCH directly, not through the read global data bus RGDB. The logic circuits LC1 through LC4 are connected to the write latch part WLCH and transfer the write data RWD1 through RWD4 directly to the write latch part WLCH, not through the write global data bus WGDB.

The multiplexer MUX, D flip-flop circuit DFF1, and gate circuit G1 are set between the read buffer RB as well as write buffer WE and the read/write data line RWD just as in the other embodiments.

Because the logic circuits LC1 through LC4 directly receive the read data RD1 through RD4, as shown in FIG. 12, the D flip-flop circuit DFF2 of the comparison buffer CMPB can be omitted. The components of the D flip-flop circuit DFF1, multiplexer MUX and gate circuit G1 may be the same as that shown in FIG. 4. Consequently, the multiplexer MUX receives the read data RD1 through RD4 (or the corrected read data PRD1 through PRD4) via the read global data bus RGDB.

In this way, the comparison buffer CMPB, according to Embodiment 5, directly receives the read data RD1 through RD4 from the read latch part RLCH, so that there is no need to have a D flip-flop circuit DFF2. However, it is necessary to arrange the logic circuits LC1 through LC4 individually so that the read data RD1 through RD4 can be received simultaneously.

(Data Write Operation)

In the data write operation, as the read data RD1 through RD4 are latched in the read latch part RLCH, shown in FIG. 11, the read data RD1 through RD4 are directly sent to the logic circuits LC1 through LC4. Also, the read data RD1 through RD4 are stored in the D flip-flop circuit DFF1 via the read global data bus RGDB. The operation for storage of the read data RD1 through RD4 in the D flip-flop circuit DFF1 in the comparison buffer CMPB is the same as the corresponding operation in Embodiment 1. Also, the operation of holding of the write data RWD1 through RWD4 in the D flip-flop circuit DFF1 is the same as the corresponding operation in Embodiment 1. Consequently, after the read data RD1 through RD4 are stored in the D flip-flop circuit DFF1, they are refreshed by means of write data RWD1 through RWD4. Thus, the D flip-flop circuit DFF1 stores the write data RWD1 through RWD4.

After the end of a series of write sequences, the pre-charge commands PRECH1 through PRECH4 are sequentially activated. As a result, the logic circuits LC1 through LC4 compare the write data RWD1 through RWD4 with the read data RD1 through RD4. When the logic of the write data RWD1 through RWD4 is different from the logic of read data RD1 through RD4, the logic circuits LC1 through LC4 activate the write execution commands CBW_A1 through CBW_A4.

The write data RWD1 through RWD4 are sent to the logic circuits LC1 through LC4 and the write latch parts WLCH of the memory cell macros MCM1 through MCM4 respectively. The write latch parts WLCH of the memory cell macros MCM1 through MCM4 latch the write data RWD1 through RWD4 respectively.

The write execution commands CBW_A1 through CBW_A4 are directly fed from the logic circuits LC1 through LC4 to the write driver W/D. Consequently, as the write execution commands CBW_A1 through CBW_A4 are activated, the write driver W/D starts the write operation for the write data RWD1 through RWD4.

After the end of a series of write sequences, the memory enters the pre-charge state. According to Embodiment 5, the write data RWD1 through RWD4 are sent to the write latch part WLCH either directly or via the logic circuits LC1 through LC4. Consequently, the pre-charge commands PRECH1 through PRECH4 that activate the write execution commands CBW_A1 through CBW_A4 may be simultaneously activated. That is, the memory cell macros MCM1 through MCM4 may be simultaneously set in the pre-charge state.

According to Embodiment 5, the logic circuit should be arranged for each of the memory cell macros MCM1 through MCM4. However, the D flip-flop circuit DFF2 can be omitted. Also, it is possible to simultaneously pre-charge the memory cell macros MCM1 through MCM4. Embodiment 5 also can realize the effects of Embodiment 1.

Although not shown in the figure, Embodiment 5 may be used in Embodiment 2. That is, according to Embodiment 5, the read global data bus RGDB and the write global data bus WGDB may be shared and set as the global data bus RWGDB. In this case, Embodiment 5 can also realize the effects of Embodiment 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

[1. A semiconductor storage device comprising:

a memory cell array containing a plurality of memory cells;

a write driver for writing data to the plurality of memory cells; and a comparison buffer configured to temporarily store both data read from the memory cells and data to be written to the memory cells, compare the data read from the memory cells to the data to be written to the memory cells to generate a subset of the data to be written, and supply the subset of the data to be written to the write driver.]

[2. The semiconductor storage device of claim 1, wherein the memory cell array has an MRAM structure.]

[3. The semiconductor storage device of claim 1, wherein the comparison buffer includes error correction circuits for correcting data to be written.]

[4. The semiconductor storage device of claim 1, wherein the comparison buffer is of a single-port design.]

[5. The semiconductor storage device of claim 1, wherein the comparison buffer is located in an input/output gate circuit.]

[6. The semiconductor storage device of claim 1, wherein the comparison buffer has at least one logic circuit located in a memory cell macro.]

7. A semiconductor storage device comprising:

a plurality of bit lines;

a plurality of word lines;

a memory cell array containing a plurality of memory cells that are connected with the bit lines and the word lines;

a plurality of sense amplifiers which read data stored in the memory cells;

a plurality of write drivers that are configured to write data in the memory cells; and a comparison buffer that is configured to temporarily store write data to be written in the memory cells and data read from the memory cells, compare the write data with the read data to produce data to be actually written, and issue a write execution command when a pre-charge command for resetting a voltage of the bit lines is received by the comparison buffer, as a result of which the data to be actually written is written to the memory cells by the write drivers, *wherein*

*the comparison buffer comprises:*

*a first latch part that holds the write data to be written;*

*a second latch part that holds the read data; and*

*a logic part that works as follows: when the pre-charge command is activated, the read data from the second latch part is compared with the write data from the first latch part, and if the read data is different from the write data, the write execution command is activated, and*

*during a data read operation, the first and second latch parts both hold the read data,*

*the logic part maintains the write execution command in an inactive state, and*

*data read from the memory cells during a data read operation is held in the first latch part before being overwritten by the write data.*

8. The semiconductor storage device according to claim 7, wherein, if the read data is different from the write data to be written, the comparison buffer activates the write execution command; on the other hand, if the read data is identical to the write data to be written, the comparison buffer does not activate the write execution command.

9. The semiconductor storage device according to claim 7, further comprising:

a write buffer for sending the write data stored in the comparison buffer to the memory cells; wherein the comparison buffer outputs the write execution command to the write buffer; and when the read data and the write data to be written are different from each other, the write buffer sends the write data to the memory cells; on the other hand, when the read data is identical to the write data to be written, the write buffer does not send the write data to the memory cells.

[10. The semiconductor storage device according to claim 7, wherein the comparison buffer comprises:

a first latch part that holds the write data to be written;

a second latch part that holds the read data; and a logic part that works as follows: when the pre-charge command is activated, the read data from the second latch part is compared with the write data from the first latch part, and if the read data is different from the write data, the write execution command is activated.]

[11. The semiconductor storage device according to claim 10, wherein the read data held in the first latch part are overwritten by the write data.]

[12. The semiconductor storage device according to claim 10, wherein during a data read operation, the first and second latch parts both hold the read data, and the logic part maintains the write execution command in an inactive state.]

13. The semiconductor storage device according to claim [10] *7*, further comprising:

an error correction part that corrects [the] *an* error of the read data from the selected memory cells; wherein during a data read operation, the first latch part holds the read data as corrected by the error correction part[;], *and* when the corrected read data held in the first latch part is different from the read data held in the second latch part, the logic part sets the write execution command in an active state.

14. The semiconductor storage device according claim 7, wherein the read data and write data compared by the comparison buffer have the same address.

15. A method of writing data to a non-volatile storage device, comprising:

selecting a memory address to be written with incoming data;

reading data already stored at the memory address;

storing the data read from the memory address in a comparison buffer;

storing the incoming data in the comparison buffer, such that both data read from the memory address and the incoming data are stored in the comparison buffer;

comparing, in the comparison buffer, the incoming data and the data read from the memory address; *and* based on the comparison in the comparison buffer, writing *the incoming* data to the memory address only when the incoming data differs from the data read from the memory address, *wherein the comparison buffer comprises a multiplexer, a NOR gate, a first D flip-flop gate, a second D flip-flop gate, and logic circuit*.

16. The method of claim 15, further comprising correcting, with error control circuits, the data read from the selected memory address before performing the comparison with incoming data in the comparison buffer.

17. The method of claim 15, wherein the storing of the data read from the selected memory address in the comparison buffer is performed at the same time as the storing of the incoming data.

18. The method of claim 15, wherein reading data already stored at the selected memory address is performed with sense amplifiers.

19. The method of claim 15, wherein writing data to the selected memory address is performed by write drivers.

[20. The method of claim 15, wherein the comparison buffer comprises a multiplexer, a NOR gate, a first D flip-flop gate, a second D flip-flop gate, and logic circuit.]

* * * * *